US011830897B2

(12) United States Patent
Gao et al.

(10) Patent No.: US 11,830,897 B2
(45) Date of Patent: Nov. 28, 2023

(54) SQUARE-GATE SOURCE-FOLLOWER FOR CMOS IMAGE SENSOR PIXEL

(71) Applicant: SHENZHEN GOODIX TECHNOLOGY CO., LTD., Shenzhen (CN)

(72) Inventors: Yunfei Gao, San Diego, CA (US); Tae Seok Oh, San Diego, CA (US); Jinwen Xiao, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 391 days.

(21) Appl. No.: 17/141,141

(22) Filed: Jan. 4, 2021

(65) Prior Publication Data

US 2022/0216252 A1 Jul. 7, 2022

(51) Int. Cl.
*H01L 27/146* (2006.01)
*H04N 25/76* (2023.01)

(52) U.S. Cl.
CPC .. *H01L 27/14614* (2013.01); *H01L 27/14603* (2013.01); *H01L 27/14616* (2013.01); *H01L 27/14643* (2013.01); *H04N 25/76* (2023.01)

(58) Field of Classification Search
CPC ......... H01L 27/14614; H01L 27/14603; H01L 27/14616; H01L 27/14643; H04N 25/76
See application file for complete search history.

(56) References Cited

U.S. PATENT DOCUMENTS

2011/0049590 A1* 3/2011 Itonaga ............ H01L 27/14689 257/292

* cited by examiner

*Primary Examiner* — Tucker J Wright
(74) *Attorney, Agent, or Firm* — KILPATRICK TOWNSEND & STOCKTON LLP

(57) ABSTRACT

Techniques are described for implementing a square-gate source-follower (SGSF) transistor for integration with complementary metal-oxide semiconductor (CMOS) image sensor (CIS) pixels. The SGSF transistor can have an active layer with active regions, including a drain region separated from each of two source regions to form parallel current channels. A square-gate structure layer includes main-gate regions, each disposed above a corresponding one of the current channels, and a side-gate region to couple the main-gate regions. At a particular physical width (W) and current channel length (L), the parallel current channels can act similarly to a conventional linear source-follower having dimensions of 2W and the same L. SGSF implementations can provide a number of features, including higher frame rate, lower power consumption, and lower noise, as compared to those of a conventional source-follower transistor of comparable W and L dimensions.

12 Claims, 7 Drawing Sheets

SQUARE-GATE SOURCE-FOLLOWER FOR CMOS IMAGE SENSOR PIXEL

FIELD

The present invention relates generally to complementary metal-oxide semiconductor (CMOS) image sensors. More particularly, embodiments relate to square-gate source-follower transistor designs for integration with CMOS image sensor (CIS) pixels.

BACKGROUND

Many modern electronics applications include integrated digital cameras and/or other imaging systems, which are based on complementary metal-oxide semiconductor (CMOS) image sensor (CIS) technologies. A CIS can typically include an array of pixels, each including a single photo-sensor (e.g., photodiode), or a grouping of multiple photo-sensors. Each pixel can also include supporting hardware, such as a source-follower transistor for converting the optical responses of the photo-sensors into corresponding electrical signals for use by other components. Performance of a pixel can relate to its size. For example, increasing the size of the photodiode area in the pixel can increase the photodiode's full-well capacitance (FWC), which tends to support higher dynamic range, higher contrast, and/or other image performance improvements. Similarly, increasing the active area of the source-follower transistor can improve the pixel's noise performance, such as by increasing its signal-to-noise ratio (SNR).

For any given pixel size, the footprint must be shared by both the photo-sensor(s) and the source-follower transistor. As such, any increase in the size of one forces a decrease in the size of the other, such that the pixel design conventionally represents a trade-off between image performance (relating to size and corresponding FWC of the photo-sensors) and noise performance (relating to active area of the source-follower transistor). As pixel dimensions continue to decrease, it becomes increasingly difficult to maintain acceptable noise performance while optimizing FWC.

BRIEF SUMMARY OF THE INVENTION

Embodiments provide circuits, devices, and methods for implementing a square-gate source-follower transistors for integration with complementary metal-oxide semiconductor (CMOS) image sensor (CIS) pixels. The square-gate source-follower (SGSF) transistor includes parallel current channels. For example, the transistor has an active layer with active regions, including a drain region separated from each of two source regions to form parallel current channels. A square-gate structure layer includes main-gate regions, each disposed above a corresponding one of the current channels, and a side-gate region to electrically couple the main-gate regions. In some implementations, the side-gate region overlaps with shallow trench isolation (STI) regions along the sides of the SGSF transistor. At a particular physical width (W) and current channel length (L), the parallel current channels can act similarly to a conventional linear source-follower having dimensions of 2W and L. The effective increase in width and/or gate length across the STI regions can provide a number of features, including higher frame rate, lower power consumption, and lower noise, as compared to a conventional source-follower transistor of dimensions W and L.

According to one set of embodiments, a source-follower transistor is provided. The source-follower transistor includes: an active layer comprising a drain-doped region separated from a first source-doped region by a first current channel, and separated from a second source-doped region by a second current channel; and a square-gate layer. The square gate layer includes: a first main-gate region disposed above the first current channel to a first side of the drain-doped region; a second main-gate region disposed above the second current channel to a second side of the drain-doped region opposite the first side of the drain-doped region; and a side-gate region disposed to a third side of the drain-doped region to electrically couple the first main-gate region to the second main-gate region.

According to another set of embodiments, a semiconductor image sensor is provided. The semiconductor image sensor includes a pixel, having a photodiode and a square-gate source-follower (SGSF) transistor. The SGSF transistor includes: an active layer comprising a drain-doped region separated from a first source-doped region by a first current channel, and separated from a second source-doped region by a second current channel; and a square-gate layer comprising a first main-gate region disposed above the first current channel to a first side of the drain-doped region, a second main-gate region disposed above the second current channel to a second side of the drain-doped region opposite the first side of the drain-doped region, and a side-gate region disposed to a third side of the drain-doped region to electrically couple the first main-gate region to the second main-gate region, wherein the square-gate layer is coupled with the photodiode.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
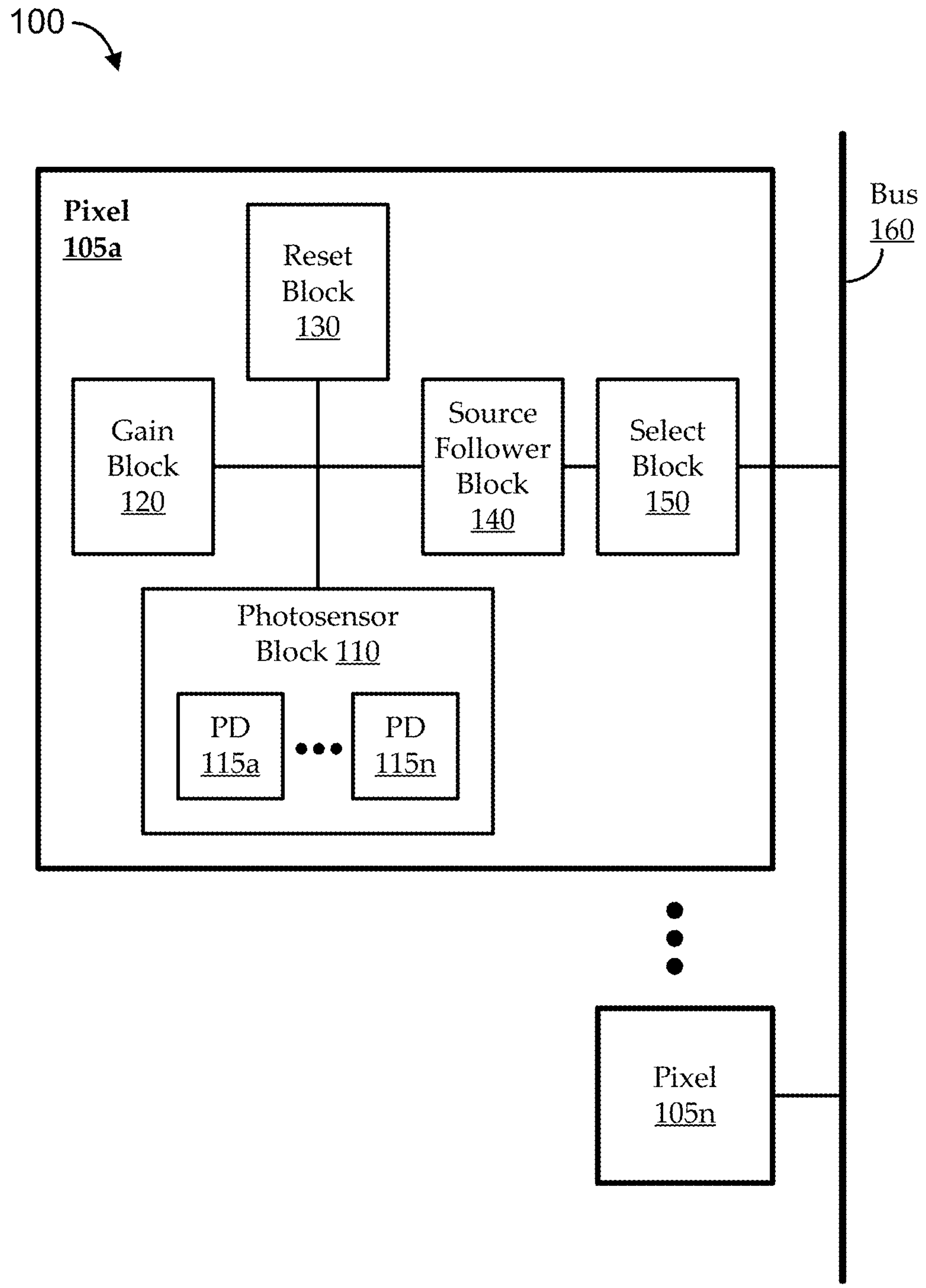
FIG. 1 shows a simplified block diagram of a portion of an illustrative digital imaging system, as context for various embodiments described herein.

FIG. 1 shows a simplified block diagram of a portion of an illustrative digital imaging system 100, as context for various embodiments described herein. The digital imaging system 100 is built around a complementary metal-oxide semiconductor (CMOS) image sensor (CIS) technology. Such a CIS system can typically include an array of pixels 105, such as millions of pixels 105 arranged in rows and columns. Each pixel 105 can include a photo-sensor block 110, which can include a single photodiode 115 (e.g., or any suitable photo sensor), or a grouping of multiple photodiodes 115. For example, each pixel 105 can be implemented with a grouping of four photodiodes 115 arranged in a Beyer color pattern (e.g., one red photodiode 115, one blue photodiode 115, an two green photodiodes 115), or any other suitable pattern.

The pixel 105 also includes additional components to facilitate sage of the photo-sensor block 110 for optical sensing. As illustrated, embodiments can include a gain block 120, a reset block 130, a source-follower block 140, and a select block 150. The gain block 120 can control gain for the pixel 105, such as by implementing dual conversion gain (DCG). The reset block 130 can selectively reset the pixel 105 components. The source-follower block 140 can support conversion of outputs from the photo-sensor block 110 into an electrical signal indicative of optical information detected by the photo-sensor block 110. The select block 150 can support selection of the pixel 105 signals from among the array of pixels 105, for example responsive to a control signal received via a bus 160. For example, the bus 160 may be a column select bus, or the like.

As technology progresses, there has tended to be a drive in many application contexts to reduce the sizes pixels 105. Indeed, many digital imaging applications are seeking ever-increasing numbers and densities of pixels 105 on their image sensor chips (i.e., driving decreases in pixel 105 sizes), while also demanding that designs continue to meet or exceed multiple performance parameters, such as relating to image contrast, dynamic range, capture frame-rate, signal-to-noise ratio (SNR), power consumption, etc. However, it has been demonstrated that certain performance parameters of pixels 105 tend to be adversely impacted by reducing the sizes of components within the pixel 105. For example, decreasing the size of a photodiode 115 in the photo-sensor block 110 can decrease its full-well capacitance (FWC), which can tend to yield lower dynamic range, lower contrast, and/or other image performance reductions. Similarly, decreasing the active area of the source-follower block 140 can reduce the pixel's 105 noise performance, such as by reducing its signal-to-noise ratio (SNR). For example, decreasing the active area of the source-follower block 140 can tend to increase its susceptibility to low-frequency noise (sometimes referred to as 1/f noise), and/or burst noise (also referred to as random telegraph signal (RTS) noise, impulse noise, bi-stable noise, etc.). Some conventional pixel 105 designs seek to maximize component sizes within the limited footprint of the pixel 105, but the footprint of each pixel 105 is shared by all its components; increasing the size of one component (e.g., the photo-sensor block 110) tends to require decreasing the size of another (e.g., source-follower block 140). As such, conventional pixel 105 designs are often forced into a trade-off between image performance (relating to size and corresponding FWC of the photo-sensors) and noise performance (relating to active area of the source-follower transistor).

Figure 2A:
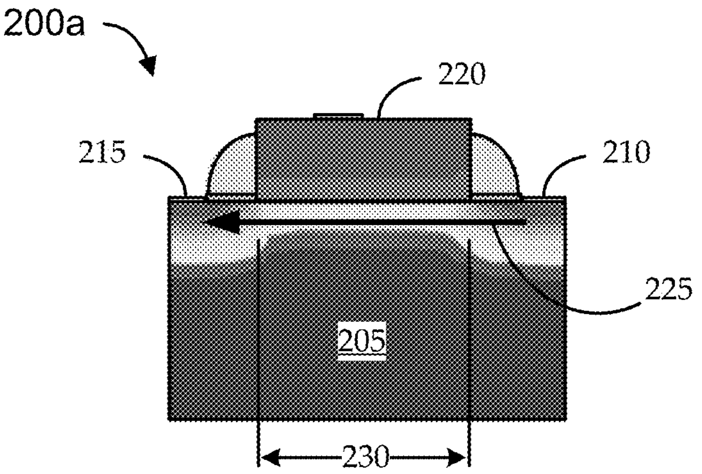
FIGS. 2A and 2B show a side cross-sectional view and a perspective view, respectively, of a conventional source-follower block implemented as a planar source-follower transistor, as is typical for conventional CIS pixel designs.
Figure 2B:
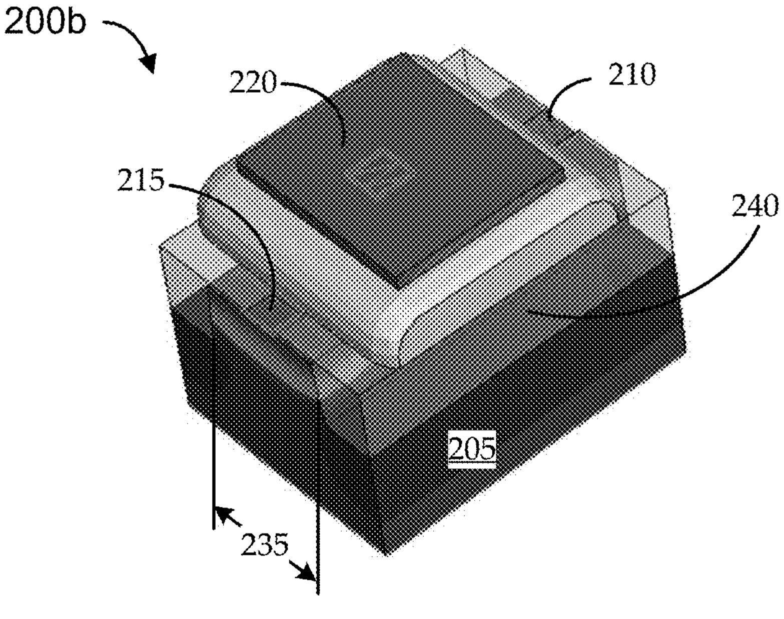

As pixel 105 dimensions continue to decrease, it is becoming increasingly difficult even to reach an acceptable trade-off between image performance and noise performance. For the sake of added context, FIGS. 2A and 2B show a side cross-sectional view and a perspective view, respectively, of a conventional source-follower block 140 implemented as a planar source-follower transistor 200, as is typical for conventional CIS pixel designs. As illustrated, the planar source-follower transistor 200 includes a drain region 210, a source region 215, and a gate region 220, all implemented on a substrate 205. For example the substrate 205 is a p-doped silicon wafer, each of the drain region 210 and the source region 215 is a respective n-doped region of the substrate 205, and the gate region 220 is a polysilicon structure deposed built (e.g., by deposition) on the substrate 205. Applying a gate voltage to the gate region 220 can cause a current channel to form and current to flow between the drain region 210 and the source region 215 in the direction of arrow 225. The length of the current channel (L) is shown as dimension 230 in FIG. 2A. The active region width (W) of the planar source-follower transistor 200 is shown in FIG. 2B as dimension 235. Also as shown in FIG. 2B, the active region can be bounded (e.g., isolated from neighboring devices) using isolation regions 240, such as shallow trench isolation (STI) regions.

Realizing a particular level of performance of a CIS pixel can involve implementing the source-follower block 140 to yield at least a threshold level of transconductance (g_m) within a threshold acceptable noise level. The amount of transconductance can functionally correspond to performance characteristics, such as frame rate, power consumption, and certain types of noise. In general, the transconductance of a generalized source-follower transistor at the saturation region can be computed as:

$$g_m = WC_{ox}V_{sat}$$

where W is the width of the source-follower transistor (e.g., dimension 235 of FIG. 2B in a conventional design), C_ox is the oxide capacitance, and v_sat is the saturation voltage. It can be seen that the transconductance of the source-follower transistor tends to be proportional to its width, such that a decrease in width tends to yield a corresponding decrease in transconductance-related performance.

Further, the voltage noise at the source-follower transistor gate (S_vg) can be computed as:

$$S_{V_g} = \frac{M}{C_{ox}^2 WL} \frac{1}{f^\beta}$$

where M is an empirical parameter, and β is a frequency-related parameter. The voltage signal at the source-follower transistor gate tends to be proportional to the gate capacitance, described by C_ox*W*L, where L is the current channel length (e.g., dimension 230 of FIG. 2A in a conventional design). From the gate voltage noise and the gate voltage signal, it can be derived that the SNR for the source-follower transistor is functionally related to $C\_ox^3*W^2*L^2$. Thus, it can be seen that the SNR of the source-follower transistor tends to be proportional to its width and length, such that a decrease in the size of the source-follower transistor tends to yield a corresponding decrease in noise performance. Notably, in conventional designs, such noise performance tends to further reduced at the device edges, such as in the isolation regions 240. For example, current flowing in the current channel can become trapped in STI regions and can contribute additional noise.

Many modern digital imaging applications have pushed pixel dimensions down to scales of around 1.12 micrometers. Even at such small scales, some conventional designs based on a planar source-follower transistor 200 have achieved sufficient transconductance ($g_m$) at an acceptable noise level to provide high CIS performance. However, as pixel dimensions continue to decrease, it becomes exceedingly difficult, impractical, or even impossible, to maintain desired levels of both transconductance ($g_m$) and SNR.

Embodiments described herein provide a novel source-follower block 140 implemented using a square-gate source-follower (SGSF) transistor. In general, embodiments of SGSF transistors described herein are designed with parallel current channels, such as by implementing a single drain region separated from each of two source regions by a respective current channel. The SGSF transistor further includes a square-shaped gate structure (e.g., having three or four sides) that has two main-gate regions, each disposed above a corresponding one of the parallel current channels, and a side-gate region to electrically couple the main-gate regions. Driving the parallel current channels by the square-gate structure can effectively double the width of the active region of the source-follower block 140 without physically changing the width of the device. As can be seen from the mathematical relationships described above, doubling the effective width can produce corresponding increases in both transconductance-related and noise-related performance.

Figure 3A:
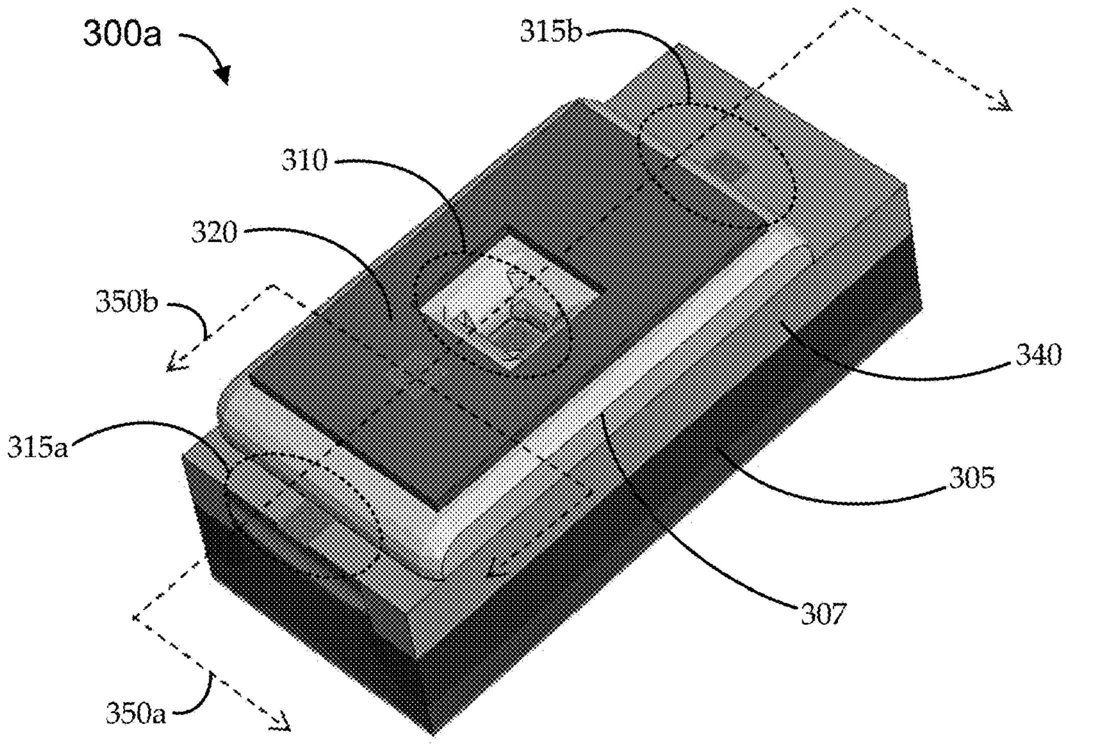
FIGS. 3A-3D show various views of an illustrative novel square-gate source-follower (SGSF) transistor, according to various embodiments described herein.

FIGS. 3A-3D show various views of an illustrative novel square-gate source-follower (SGSF) transistor 300, according to various embodiments described herein. The SGSF transistor 300 can be an implementation of the source follower block 140 of FIG. 1. Turning first to FIG. 3A, a perspective view of the SGSF transistor 300 is shown. As illustrated, embodiments of the SGSF transistor 300 include an active layer 305 and a square-gate layer 320. Embodiments can also include various insulation layers and related structures. Some implementations include inter-later structures 307, such as silicon nitride spacers, insulating oxide layers, etc. Some implementations include shallow-trench isolation (STI) regions and/or other edge isolation structures 340, such as to isolate between transistors and/or other components on the substrate of the pixel.

The active layer 305 can be implemented using a silicon substrate, such as a portion of a silicon wafer. The active layer 305 includes a drain-doped region 310 separated from a first source-doped region 315*a* by a first current channel, and separated from a second source-doped region 315*b* by a second current channel. Each of the drain-doped region 310 and the source-doped regions 315 are denoted by dashed circles intended to represent the approximate locations of the respective regions. In some implementations, each of the drain-doped region 310 and the source-doped regions 315 are n-doped regions (e.g., wells) in a p-doped substrate, such that application of a voltage proximate to the current channels causes current to flow in parallel from the drain-doped region 310 to the two source-doped regions 315. Alternatively, each of the drain-doped region 310 and the source-doped regions 315 can be p-doped regions (e.g., wells) in an n-doped substrate, such that application of a voltage proximate to the current channels restricts current from flowing in the current channels between the drain-doped region 310 to the source-doped regions 315.

As used herein in context of current, the term "parallel" is intended to mean electrically (not necessarily geometrically) parallel. In particular, references to "parallel" current channels means that current from a single circuit node (e.g., the drain-doped region 310) splits along multiple current paths (e.g., to two separate source-doped regions 315) along independent paths, regardless of the geometric relationship between those paths. For example, the current channels in the illustrated SGSF transistor 300 provide parallel current paths between the drain and source regions of the transistor, even though they are geometrically collinear (not geometrically parallel to each other). Further, the term "current channels" is used herein to refer to a region through which current is intended to flow by design under particular operating conditions, even if current is not presently flowing in that region. For example, one of ordinary skill in the art will understand that references herein to the drain-doped region 310 being separated from source-doped regions 315 by current channels provides a clear description of the physical relationship between the drain-doped region 310 and the source-doped regions 315, even when the device is not operating and/or no current is otherwise flowing.

Embodiments of the square-gate layer 320 include at least two main-gate regions and at least one side-gate region. The embodiment of the SGSF transistor 300 illustrated in FIGS. 3A-3D includes two main-gate regions and two side-gate regions, geometrically forming a square around the drain-doped region 310. In other embodiments, SGSF transistor 300 can have two main-gate regions coupled by a single side-gate region, such as geometrically forming a C-shape around three-fourths of the drain-doped region 310. Features of the square-gate layer 320 are described with reference to all of FIGS. 3A-3D for added clarity.

Figure 3B:
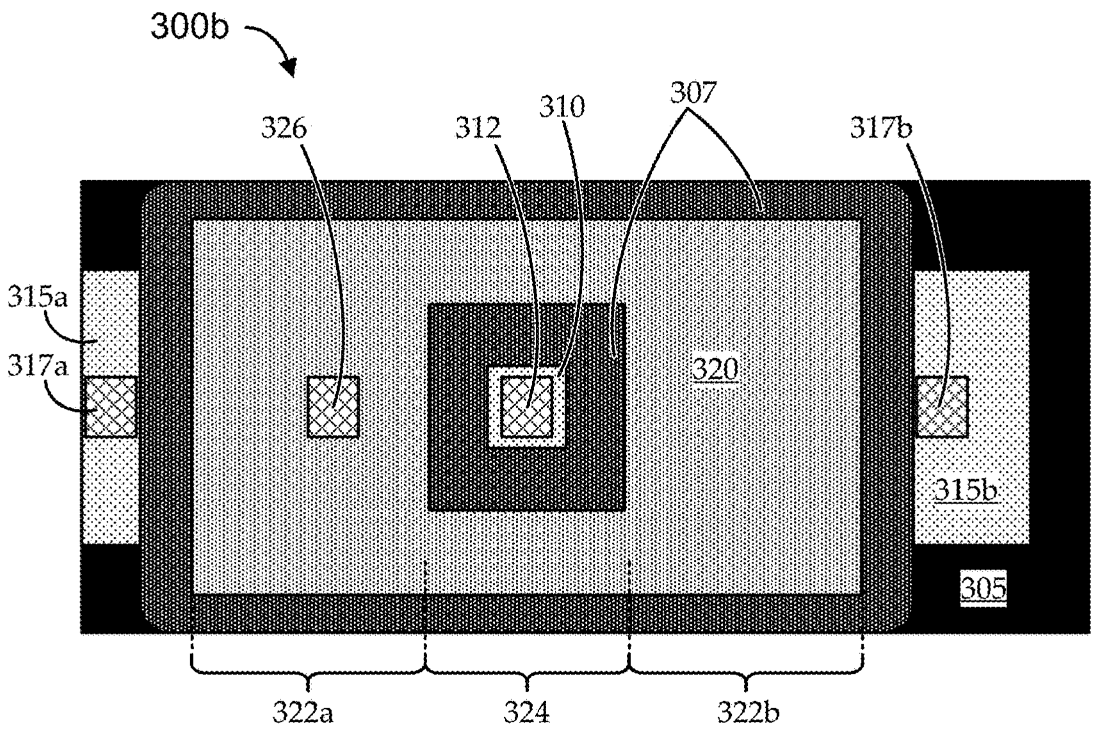

FIG. 3B shows a top view of the SGSF transistor 300 of FIG. 3A. As illustrated in FIG. 3B, embodiments of the square-gate layer 320 can generally include main-gate regions 322 and side-gate regions 324, geometrically forming a square around the drain-doped region 310. The entire square-gate layer 320 can be formed as a single deposed structure, such as a polysilicon structure formed on the substrate 305 by any suitable foundry or other process. In some embodiments, the drain-doped region 310 has a drain contact 312 electrically coupled with and disposed thereon, each of the source-doped regions 315 has a respective source contact 317 electrically coupled with and disposed thereon, and the square-gate layer 320 has a gate contact 326 electrically coupled with and disposed thereon. The side-gate regions 324 electrically couple together the main-gate regions 322. As such, a single gate contact 326 can be used to control voltage to the entire square-gate layer 320 (i.e., at least to both main-gate regions 322).

Figure 3C:
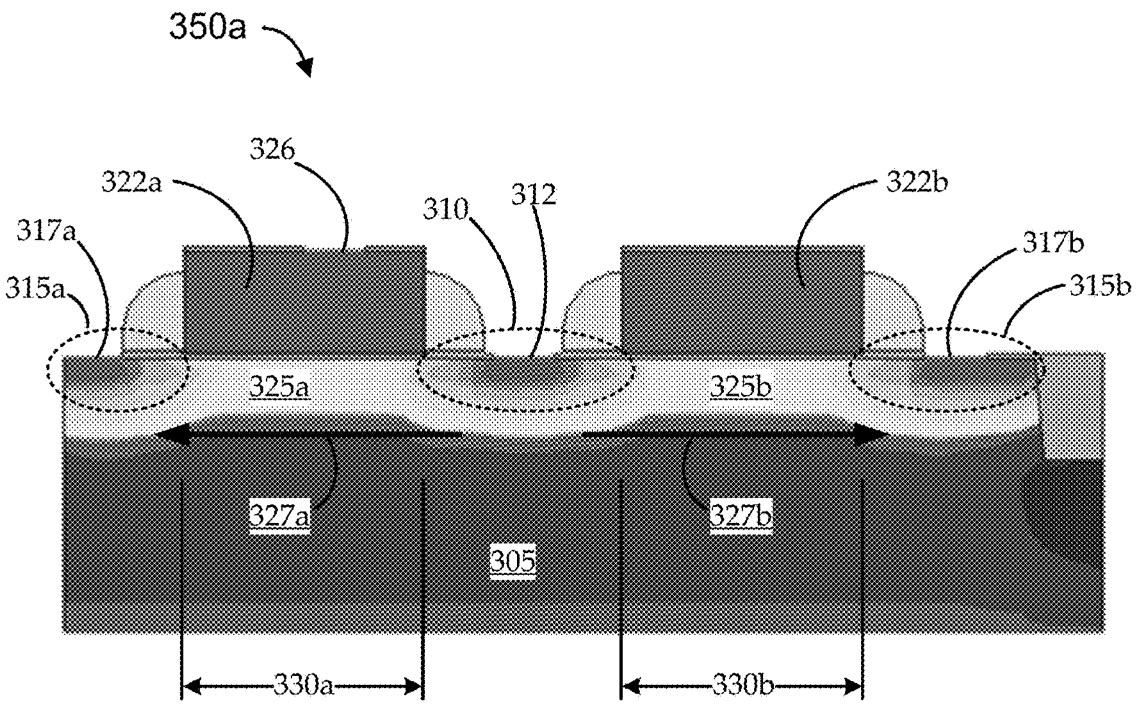

FIG. 3C shows a length-wise cut view of the SGSF transistor 300 of FIG. 3A, cut in accordance with cut line 350*a* of FIG. 3A. As illustrated, each main-gate region 322 of the square-gate layer 320 is disposed above a respective current channel to a respective side of the drain-doped region 310 opposite each other. For example, the first main-gate region 322*a* is disposed above the first current channel 325*a* (between the drain-doped region 310 and the first source-doped region 315*a*), and the second main-gate region 322_b_ is disposed above the second current channel 325_b_ (between the drain-doped region 310 and the second source-doped region 315_b_). Arrows 327 show an example direction for current flow through the respective current channels 325, indicating that flow of the drain current effectively splits along the two current channels 325 to flow in different directions. Each current channel 325 has an associated channel length (L) 330. In some embodiments, the current channels 325 are designed to be matched, such as by being equivalent in channel length 330, doping, etc., such that current will split equally between the channels. Such design-intended parameter values are referred to herein as "nominal" values. For example, some embodiments of the SGSF transistor 300 are designed to have nominally identical current channels, such as with the same nominal channel length 330. However, it may be impractical or impossible (e.g., due to process variations and tolerances, material non-homogeneity, etc.) to manufacture the SGSF transistor 300 with identical current channels 325.

Figure 3D:
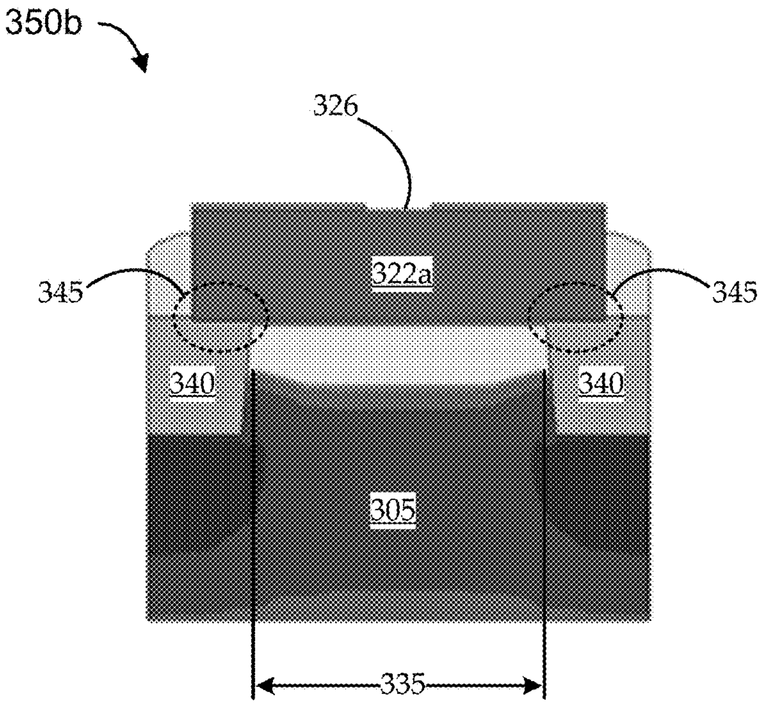

FIG. 3D shows a width-wise cut view of the SGSF transistor 300 of FIG. 3A, cut in accordance with cut line 350_b_ of FIG. 3A. While only the first main-gate region 322_a_ can be seen in the cut view, a similar width-wise cut through the second main-gate region 322_b_ would look substantially the same (e.g., though implementations can have only one gate contact 326 on only one of the main-gate regions 322). As illustrated, at least because of doping parameters and the edge isolation structures 340, the active region of the active layer 305 (i.e., the source-doped region 315_a_ in FIG. 3D) has a definable width (W) 335. In some implementations, the width 335 is determined, at least in part, by pixel design parameters and manufacturing process constraints. For example, as noted above, the pixel footprint design balances allocated space between the photo-sensor block 110 and supporting components, including the source follower block 140 (which can be implemented by the SGSF transistor 300). The allocated space can typically define the maximum (or nominal) width of transistor components.

In some embodiments, the width 335 of the SGSF transistor 300 and the current channel length 330 of each current channel 325 can be similar to that of a conventional planar source-follower transistor used in conventional CIS photo-sensor blocks. In other embodiments, the channel length 330 is at least half the width 335, such that the overall physical length of the SGSF transistor 300 is greater than its overall width. For example, L is greater than or equal to sixty percent of W. However, as described herein, the SGSF transistor 300 architecture provides two parallel current channels 325 of length (L) 330 within the same width (W) 335. Such an architecture manifests operationally as the SGSF transistor 300 having an apparent width of approximately 2W. In effect, the apparent width of the active region (from an operational electromagnetic perspective) is approximately twice the physical width consumed by the SGSF transistor 300 in the pixel footprint. It can be demonstrated that transconductance of source-follower transistors is proportional to a ratio of W to L (i.e., to W divided by L). As such, doubling W with the same L can nominally double the transconductance of the transistor.

For example, a transconductance relationship for a source-follower transistor can be described as follows:

$$g_m^2 = 2C_{ox}\mu_{eff}\frac{W}{Lm}I_D = \left(2\mu_{eff}\frac{\varepsilon_0\varepsilon_{OX}}{m}I_D\right)\left(\frac{W}{L_g g_{OX}}\right).$$

As noted above, g_m is the transconductance, W is the active region width (or apparent width as in the SGSF transistor 300), L is the current channel length (L_g is the gate length, which corresponds to L), and I_D is the drain current (i.e., essentially the output of the transistor). Other parameters, such as C_ox (oxide capacitance), μ_eff (effective gain), m (body coefficient), and g_ox (oxide thickness) tend to be relatively constant and dependent on the manufacturing process and other such characteristics. It can be seen from this relationship that transconductance has a proportional relationship to the ratio of W to L for the source-follower transistor (i.e., whether the traditional planar source-follower transistor, or the novel SGSF transistor 300). Thus, increasing W relative to L (e.g., nominally doubling W) provides a number of features.

One such feature relates to frame rate. The above relationship demonstrates that $gm^2$ is linearly proportional to the term (W/L_g*g_ox) with constant current. Due at least to such a relationship, transconductance tends to contribute to a maximum frame rate supported by the pixel in the CIS. As such, increasing the W/L ratio by building CIS pixels with SGSF transistors 300 can tend to support higher frame rates of image acquisition.

Another such feature relates to power consumption. The above relationship demonstrates that $gm^2$ is linearly proportional to the product of the drain current and the W/L ratio. As such, by increasing the W/L ratio, the same transconductance can be achieved with lower current, and thereby with lower power consumption. For example, if W/L is doubled in the above relationship (i.e., to 2W/L), the same $gm^2$ can be achieved with half the drain current.

Another such feature relates to noise performance. It can be shown that within particular manufacturing parameters (e.g., C_ox), the drain current correlates to the surface carrier density (Ne), such that:

$$g_m = \mu_{eff}\frac{W}{Lm}N_e.$$

As such, transconductance is linearly proportional to the surface carrier density. Deeper channel implanting in the source-follower transistor can reduce surface carrier density and associated noise, but tends also to decrease transconductance. Thus, channel implant depth typically represents a trade-off between transconductance-related performance (e.g., efficiency) and noise-related performance. However, by increasing the W/L ratio, the same transconductance can be achieved with smaller surface carrier density (e.g., with deeper channel implanting), and thereby with less associated noise. For example, if W/L is doubled in the above relationship (i.e., to 2W/L), the same gm can be achieved with half the surface carrier density.

Some embodiments of the SGSF transistor 300 include additional features relating to noise performance. As illustrated in FIG. 3D, the square-gate layer 320 overlaps with the edge isolation structures 340 along at least one or both length-wise edges of the SGSF transistor 300. For example, two overlap regions 345 are illustrated. Edge isolation structures 340, such as STI regions, tend to have high electric field strengths ("E-fields") and tend to trap electrons, which can produce relatively high amounts of noise. In those overlap regions 345 of the SGSF transistor 300, the gate length is effectively longer. This tends to suppress current flow along the length-wise edges of the SGSF transistor 300, thereby reducing the noise conventionally produced in those regions.

Figure 4:
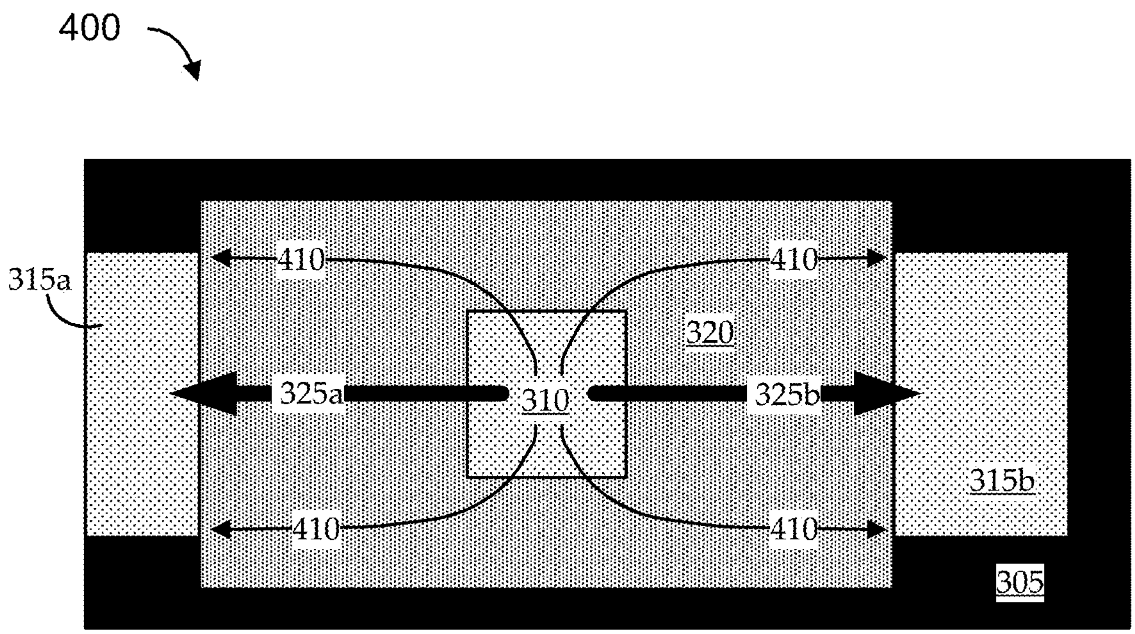
FIG. 4 shows a simplified top view of an illustrative SGSF transistor with two side-gate regions.
Figure 5:
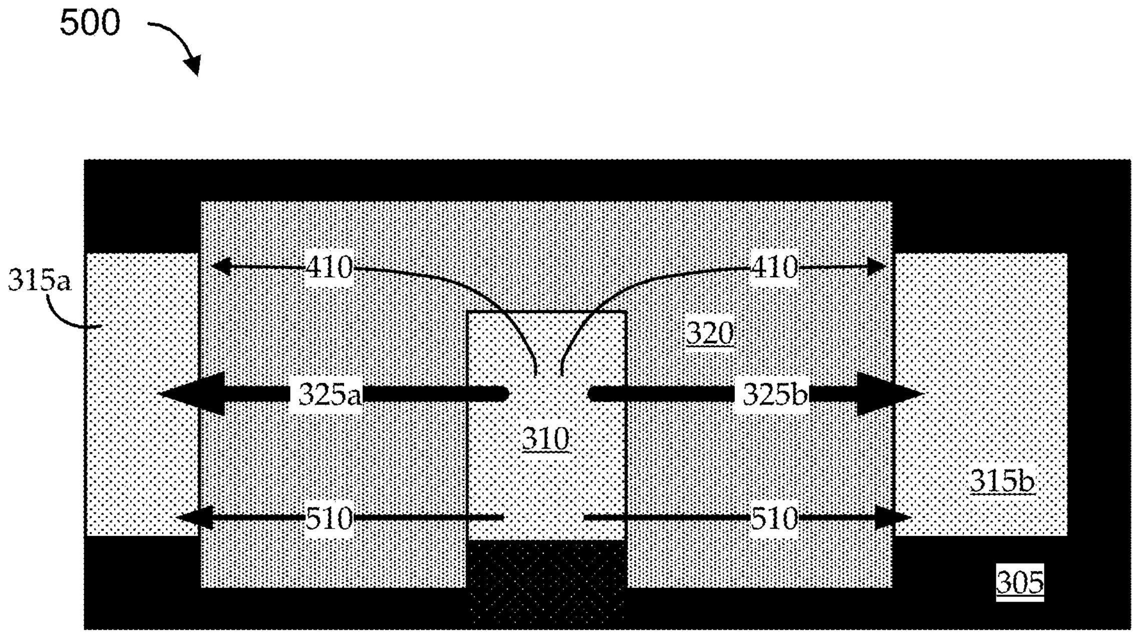
FIG. 5 shows a simplified top view of an illustrative SGSF transistor with only a single side-gate region.

FIGS. 4 and 5 further illustrate the effects of desired current flow through current channels 325 and incidental current flow in other regions, according to various embodiments. FIG. 4 shows a simplified top view of an illustrative SGSF transistor 400 with two side-gate regions 324, similar to the SGSF transistor 300 of FIG. 3. As illustrated, the SGSF transistor 400 includes a square-gate layer 320 with first and second main-gate regions 322 and first and second side-gate regions 324, forming a square around four sides of a drain-doped region 310. The drain-doped region 310 is separated from each of two source-doped regions 315 by respective current channels 325. Thick arrows show an example direction of parallel current flow through the channels from the drain-doped region 310 to each source-doped region 315. In addition to the desired current flow through the current channels 325, there is also incidental current flow along the edges (indicated by arrows 410) due at least in part to the E-fields of the edge isolation structures 340. It can be seen, however, that the current paths indicated by arrows 410 are longer than the current channels 325. As current tends to prefer a shorter current path (e.g., with all else being equal), longer effective gate path at the edges (due to the side-gate regions 324 overlapping the edge isolation structures 340) will tend to reduce the amount of current flowing along the length-wise edges of the SGSF transistor 300.

FIG. 5 shows a simplified top view of an illustrative SGSF transistor 500 with only a single side-gate region 324. The square-gate layer 320 includes first and second main-gate regions 322 coupled together by a single side-gate region 324, forming a partial square (e.g., a C-shape) around three of four sides of the drain-doped region 310. As in FIG. 4, the drain-doped region 310 is separated from each of two source-doped regions 315 by respective current channels 325, and thick arrows show an example direction of parallel current flow through the channels from the drain-doped region 310 to each source-doped region 315. Also as in FIG. 4, additional incidental current flow occurs along the edges due at least in part to the E-fields of the edge isolation structures 340. On the side of the square-gate layer 320 having the single side-gate region 324, incidental current flow may be similar to that of FIG. 4, as indicated by arrows 410. On the side of the square-gate layer 320 having no side-gate region 324, there may tend to be more incidental current flow along the corresponding edge. Still, presence of the single side-gate region 324 can reduce the overall amount of noise generated by the edge isolation structures 340.

Figure 6:
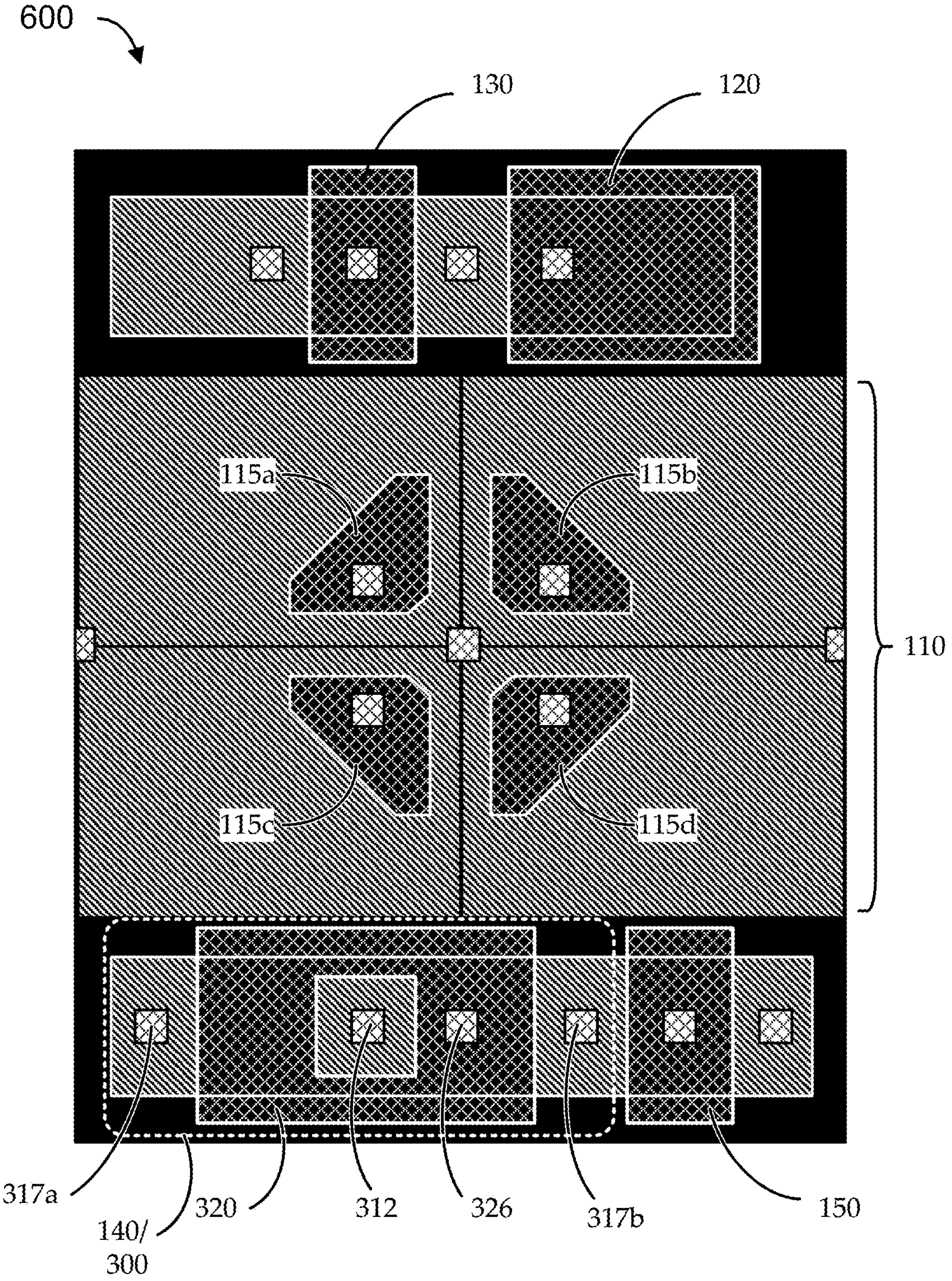
FIG. 6 shows a simplified physical layout of an illustrative CIS pixel having an integrated SGSF transistor, according to various embodiments.

FIG. 6 shows a simplified physical layout of an illustrative CIS pixel 600 having an integrated SGSF transistor 300, according to various embodiments. A center region of the illustrated layout includes a photo-sensor block 110 with four photodiodes 115. An upper portion of the illustrated layout includes a gain block 120 and a reset block 130, with corresponding contacts. A lower portion of the illustrated layout includes a select block 150 and the novel source follower block 140, implemented as SGSF transistor 300. It can be seen that the width of the various component blocks is established by the design of the layout, and that embodiments of the SGSF transistor 300 can be implemented within such a layout by consuming otherwise unused area in the length dimension (i.e., horizontal with reference to the illustrated layout). With such an implementation, the SGSF transistor 300 can be fit within conventional spacing parameters, including placing the drain contact 312, source contacts 317, and gate contact 326 in locations that can conform to conventional manufacturing processes for the CIS pixel (e.g., within typical physical design parameters of a standard 2-by-2 CIS pixel layout).

Figure 7:
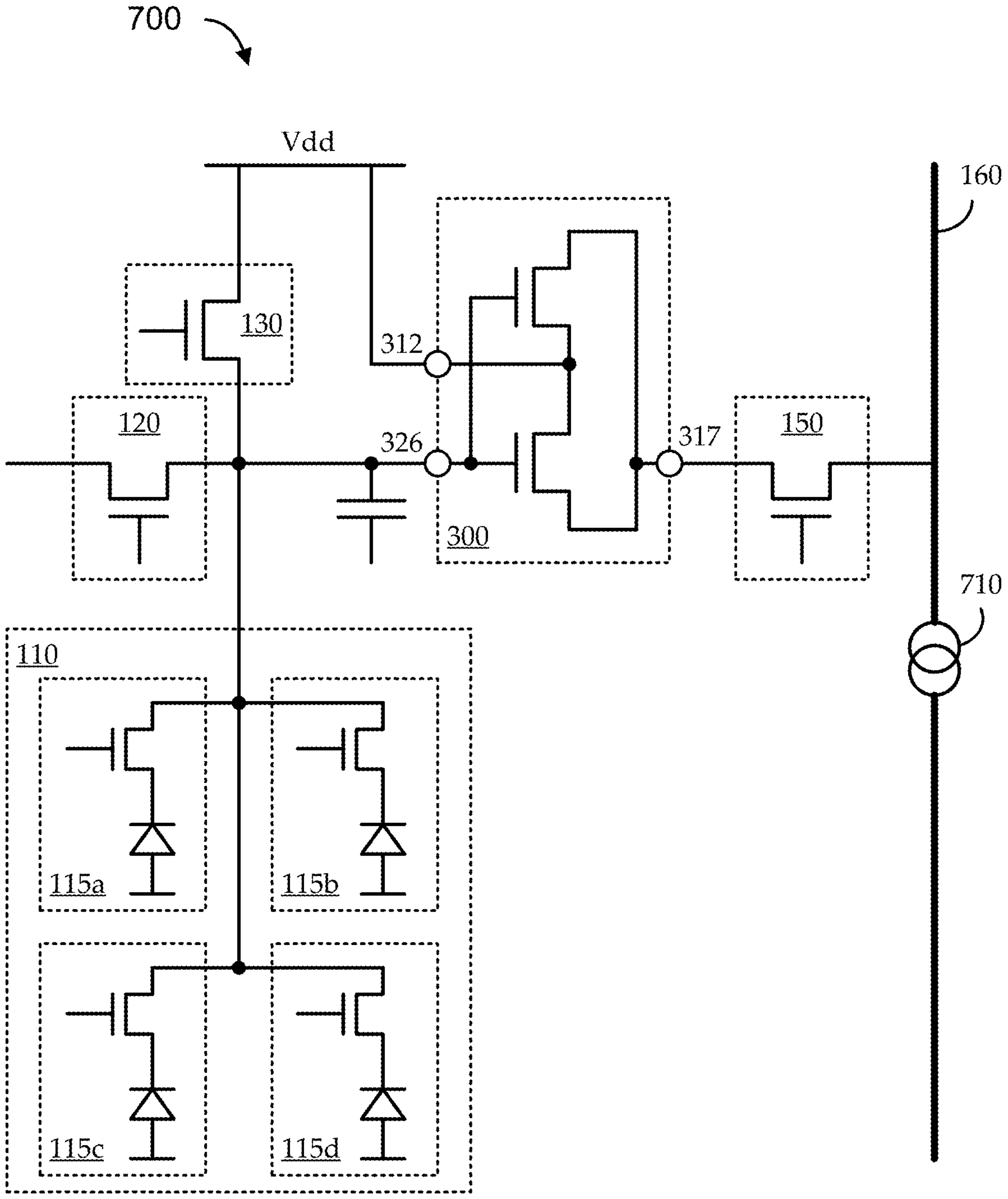
FIG. 7 shows a simplified pixel schematic for an illustrative CIS pixel having an integrated SGSF transistor, according to various embodiments.

FIG. 7 shows a simplified pixel schematic 700 for an illustrative CIS pixel having an integrated SGSF transistor 300, according to various embodiments. The schematic can represent the CIS pixel 600 shown in FIG. 6. As illustrated, the schematic includes a photo-sensor block 110 with four photodiodes 115, a gain block 120, a reset block 130, a select block 150, and a SGSF transistor 300 (as an implementation of a source follower block 140). The select block 150 is coupled between the SGSF transistor 300 and a bus 160. For example, the bus 160 is a column select bus with a bias current 710. For added clarity, the schematic of the SGSF transistor 300 is shown with schematic representations of the drain contact 312, the source contact 317, and the gate contact 326. It can be seen in the SGSF transistor 300 can effectively be modeled as two field-effect transistors (FETs) coupled active layer 305 at shared drain node (i.e., the physical implementation can include only a single drain-doped region 310, as described herein), and with their gates coupled together (i.e., the physical implementation includes the square-gate layer 320, which effectively manifests as two main-gate regions 322 coupled together via the one or more side-gate regions 324). The schematic shows only a single source contact 317. As described above, the physical design may include two separate source-doped regions 315, each with a corresponding source contact 317, and the multiple source contacts 317 may be coupled together when implemented in the circuit. In other implementations, the SGSF transistor 300 can be designed with the source-doped regions 315 coupled together, so that only a single source contact 317 is provided. In operation, the common drain node (coupled with drain contact 312) is coupled with a voltage reference (Vdd). Applying a gate voltage at gate contact 326 actuates the gates of both represented FETs, causing current to flow in parallel from the common drain node to the respective source nodes of both FETs (coupled together at source contact 317).

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A source-follower transistor comprising:

an active layer comprising a drain-doped region separated from a first source-doped region by a first current channel, and separated from a second source-doped region by a second current channel, each of the drain-doped region, the first source-doped region, and the second source-doped region physically and electrically coupled with a respective contact;

a square-gate layer comprising:

a first main-gate region disposed above the first current channel to a first side of the drain-doped region;

a second main-gate region disposed above the second current channel to a second side of the drain-doped region opposite the first side of the drain-doped region; and a side-gate region disposed to a third side of the drain-doped region to electrically couple the first main-gate region to the second main-gate region; and a gate contact physically and electrically coupled with the first main-gate region, and electrically coupled with the second main-gate region via the side-gate region.

2. The source-follower transistor of claim 1, further comprising:

an edge-isolation region running along a first edge of the source-follower transistor corresponding to the third side of the drain region, such that the side-gate region at least partially overlaps the edge-isolation region.

3. The source-follower transistor of claim 2, wherein the edge-isolation region is a shallow trench isolation (STI) region.

4. The source-follower transistor of claim 1, wherein the first current channel and the second current channel each has a same nominal channel length.

5. The source-follower transistor of claim 1, wherein:

the source-follower transistor has a width of W; and each of the first current channel and the second current channel has a nominal channel length (L); and $$0.6W \leq L \leq W.$$

6. The source-follower transistor of claim 1, wherein:

the active layer is a substrate structure;

each of the drain-doped region, the first source-doped region, and the second source-doped region is a respective n-doped region of the substrate structure;

each of the first and second current channels corresponds to respective p-doped region of the substrate structure;

the square-gate layer is a polysilicon structure; and the first and second main-gate regions of the polysilicon structure are isolated from the first and second current channels by a thin silicon dioxide layer.

7. A semiconductor image sensor comprising:

a pixel having:

a photodiode; and a square-gate source-follower (SGSF) transistor comprising:

an active layer comprising a drain-doped region separated from a first source-doped region by a first current channel, and separated from a second source-doped region by a second current channel, each of the drain-doped region, the first source-doped region, and the second source-doped region physically and electrically coupled with a respective contact;

a square-gate layer comprising a first main-gate region disposed above the first current channel to a first side of the drain-doped region, a second main-gate region disposed above the second current channel to a second side of the drain-doped region opposite the first side of the drain-doped region, and a side-gate region disposed to a third side of the drain-doped region to electrically couple the first main-gate region to the second main-gate region; and a gate contact physically and electrically coupled with the first main-gate region, and electrically coupled with the second main-gate region via the side-gate region, wherein the square-gate layer is coupled with the photodiode.

8. The semiconductor image sensor of claim 7, further comprising:

a select transistor to couple the pixel with a bus, wherein the first and second source-doped regions are coupled with the select transistor.

9. The semiconductor image sensor of claim 7, further comprising:

an array of instances of the pixel.

10. The semiconductor image sensor of claim 7, wherein each pixel comprises a plurality of photodiodes, all coupled with the square-gate layer.

11. The semiconductor image sensor of claim 7, wherein the SGSF transistor further comprises:

an edge-isolation region running along a first edge of the SGSF transistor that corresponds to the third side of the drain-doped region, such that the side-gate region at least partially overlaps the edge-isolation region.

12. The semiconductor image sensor of claim 7, wherein the first current channel and the second current channel each has a same nominal channel length.

* * * * *